TEMPERATURE COMPENSATED MICROWAVE SOURCE

Filed May 9, 1967

4 Sheets-Sheet 1

INVENTOR
Benjamin F. Gregory
BY
Blair, Buckles, Cesari & St. Onge
ATTORNEYS

TEMPERATURE COMPENSATED MICROWAVE SOURCE

United States Patent Office 3,388,348
Patented June 11, 1968

3,388,348

TEMPERATURE COMPENSATED MICROWAVE SOURCE

Benjamin F. Gregory, Tampa, Fla., assignor to Trak Microwave Corporation, Tampa, Fla.

Filed May 9, 1967, Ser. No. 637,239
10 Claims. (Cl. 331—117)

ABSTRACT OF THE DISCLOSURE

The application discloses a solid state microwave source capable of sustained continuous wave operation at constant frequency and power output throughout environmental changes in ambient temperature ranging from −55° C. to +125° C. In an alternative embodiment a frequency-modulated solid state microwave source is disclosed having broad-band frequency tuning capabilities and maintaining uniform modulation characteristics and power output over the same broad range of temperature changes. The source in both embodiments comprises a Colpitts type transistor oscillator having an integral temperature compensating network including both thermistor and "Sensistor" elements in combination with a direct current amplifier for varying the emitter current of the oscillator transistor according to a predetermined function as ambient temperature changes. The oscillator, which operates in the UHF spectrum, is directly coupled to a two-cavity frequency multiplier in a unitary compact structure with the temperature compensating elements to produce stable microwave energy output regardless of ambient temperature variations.

*Background of the invention*

Prior art techniques of achieving frequency and power stability for high frequency oscillators in changing environmental temperatures have included the use of thermostatically controlled heating or cooling apparatus in combination with substantial heat sinks. Where frequency multipliers are employed as the output stage, i.e., as the load for a fundamental oscillator, another approach toward stability of operation is to provide a vastly more powerful oscillator with substantial attenuator isolating means in order to diminish the effects of reflected changes in detuning of the multiplier and oscillator as temperature changes. These prior approaches to frequency and power stability are all wasteful of available electrical energy; they also require additional size and weight for the heavy power supply, and they are accordingly costly.

One of the principal objects of the present invention is to provide a compact, light weight, inexpensive, lower power microwave source capable of maintaining stable frequency and power output over a very substantial range of changes in ambient temperature. Another object is to provide such a microwave source capable of reliable operation in airborne or space vehicles where substantial vibrational or shock forces may occur, as well as extreme variations in environmental temperatures.

A further object of the invention is to provide a microwavesource of the above character which is capable of frequency modulation and wherein the modulating signal input versus output frequency characteristic remains substantially constant over a wide range of temperature variations. In the frequency-modulated embodiment of the invention it is also an object to provide such a microwave source electronically tunable over a wide frequency band and capable of accepting a wide variety of modulating signal inputs.

Other objects of the invention will in part be obvious and will in part appear hereinafter.

The invention accordingly comprises the features of construction, combinations of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which like references identify corresponding parts in the several figures.

*Detailed description*

Figure 11:
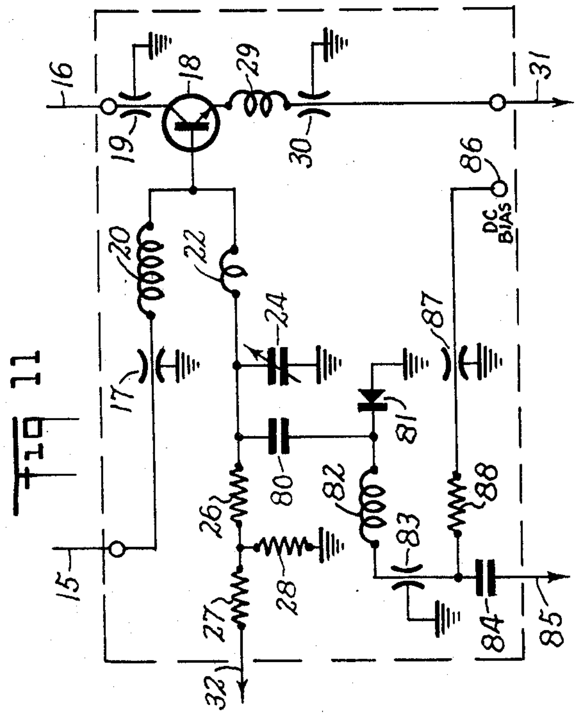
FIGURE 11 is a schematic diagram of an alternative oscillator circuit with broad band FM capability and suitable of substitution for the CW oscillator circuit of FIGURE 8.
Figures 7, 8, 9, 10:
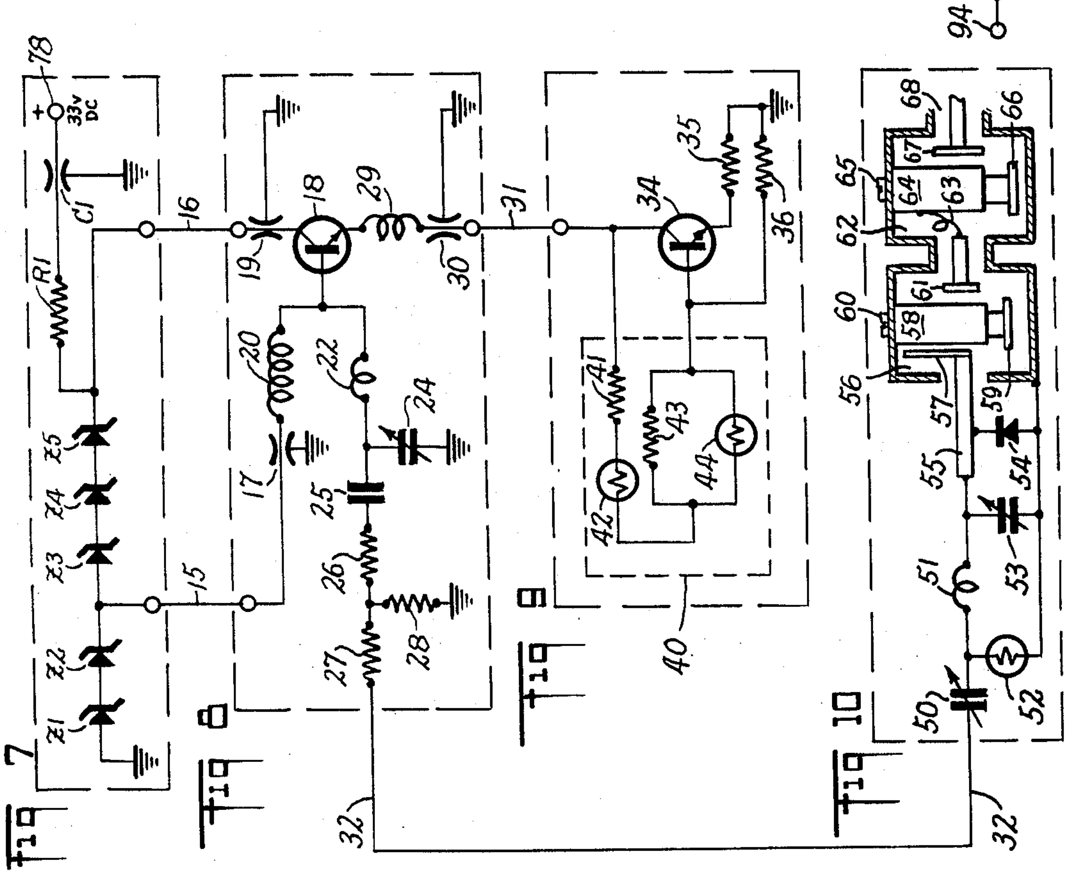
FIGURE 7 is a schematic diagram of the voltage regulator portion of the circuit.
FIGURE 8 is a schematic diagram of the fundamental UHF oscillator portion of the circuit in a CW embodiment of the microwave source.
FIGURE 9 is a schematic diagram of the temperature compensation portion of the circuit.
FIGURE 10 is a schematic diagram of the frequency multiplier portion of the circuit.

As the invention may be most readily understood through a description of the schematic diagrams, reference is now made to FIGURES 7 through 11, respectively. In FIGURE 7 an external power source of 33 volts DC and 75 milliampere rating is applied through a RF bypass feed-through capacitor C1 to a voltage divider/regulator network comprising current limiting resistor R1 and Zener diodes Z1 through Z5. The inherent stable curvature in the reverse voltage/current characteristics of the Zener diodes, in combination with resistor R1, provides the required constant voltages on lines 15 and 16 which are connected, respectively, with the base and collector terminals of a transistor 18, which may be of a type 2N3866, as shown in FIGURES 8 and 11, thus allowing substantial variations in the external 33 volt power supply without disturbing the frequency or power output of the fundamental oscillator portion of the circuit shown in FIGURE 8 or FIGURE 11. These regulated positive voltages on lines 15 and 16 are applied to the oscillator circuits of FIGURE 8 or FIGURE 11 through feed-through bypass capacitors 17 and 19. The voltage from line 15 is connected to the base of transistor 18 through a radio frequency choke 20 of approximately 22 microhenrys inductance.

As shown in FIGURES 8 and 11 a frequency selective tunable tank circuit is provided by inductance 22 and variable capacitor 24. The radio frequency output from the oscillator circuit of FIGURE 8 is fed through coupling capacitor 25 and a T-pad attenuator network comprising resistors 26, 27 and 28, which provides a calculated loss of 2 db, over connecting line 32 to the frequency multiplier circuit of FIGURE 10. The emitter terminal of transistor 18 is connected through a radio frequency choke 29 and a feed-through bypass capacitor 30 via line 31 to the temperature compensating circuit of FIGURE 9.

Referring now to FIGURE 9 of the drawings, the emitter line 31 from the oscillator of FIGURE 8 is connected to the collector terminal of a transistor 34, which may be of the type 2N1479. The emitter terminal of transistor 34 is connected to ground through a bias resistor 35 which has a value of approximately 5 ohms. The base terminal of transistor 34 is connected to ground through a selected bias resistor 36, having a value in the range of approximately 200–400 ohms. The transistor 34 is shunted, between its collector and base terminals by a temperature compensating resistive network as shown within the broken line enclosure 40 of FIGURE 9. The network 40 comprises a fixed resistor 41 in series with a "Sensistor" 42 which has a high positive temperature coefficient of resistivity. This series pair of resistive elements, 41 and 42, are in turn connected in series with a parallel combination comprising a fixed resistor 43 and a thermistor 44 which has a very high negative temperature coefficient of resistivity. The values of resistive elements 41–44 in network 40 are selected, in a preferred embodiment of the invention, to provide a nominal resistance of approximately 500 ohms at room temperature. The individual resistive elements may be selected emipirically to provide any desired curve, direction, or ange of change in network resistance in response to specified ranges of change in temperature.

The transistor 34, shunted by the temperature compensating network 40, in FIGURE 9 is connected in the emitter line 31 from transistor 18 of the oscillator circuit in FIGURE 8, whereby the circuit of FIGURE 9 limits and controls the oscillator emitter current. Thus the frequency of the oscillator, FIGURE 8, is controlled by the operation of the circuit of FIGURE 9 to change the emitter current in a degree and direction corresponding to changes in ambient temperature. Where the natural response of the oscillator circuit is to shift frequency upward as a temperature rises affect the physical characteristics of its related components, the circuit of FIGURE 9 controls the emitter current, in response to the same change in ambient temperature, to retune the oscillator and thereby maintain its frequency constant. By thus operating on the emitter current, the circuit of FIGURE 9 also maintains the power output of oscillator, FIGURE 8, constant regardless of the direction of change in ambient temperature. As both the frequency and power output of the oscillator would also be affected by any change in the applied DC voltage, and such changes in power supplies normally occur with changes in temperature, the circuit of FIGURE 7 thus cooperates with the circuit of FIGURE 9 to maintain stable frequency and power output from the oscillator of FIGURE 8 regardless of changes in ambient temperature.

The required emitter current of the oscillator, needed to maintain power oscillation, is too great to flow through the relative high impedance of the resistive network 40. That is, if the entire emitter current had to be passed through network 40 it would be so attenuated that the oscillator of FIGURE 8 would cease to function. To avoid this limitation and yet enable the temperature compensating network 40 to control the oscillator emitter current as temperature varies, the resistive network 40 is shunted by transistor 34 through which the major portion of the oscillator emitter current passes. The small portion of emitter current which flows through the temperature compensating resistive network 40 is varied in accordance with the function required to maintain the oscillator frequency and power constant, and these variations of minute currents are reflected in and amplified by transistor 34 to produce the necessary changes in the total emitter current.

Figure 1:
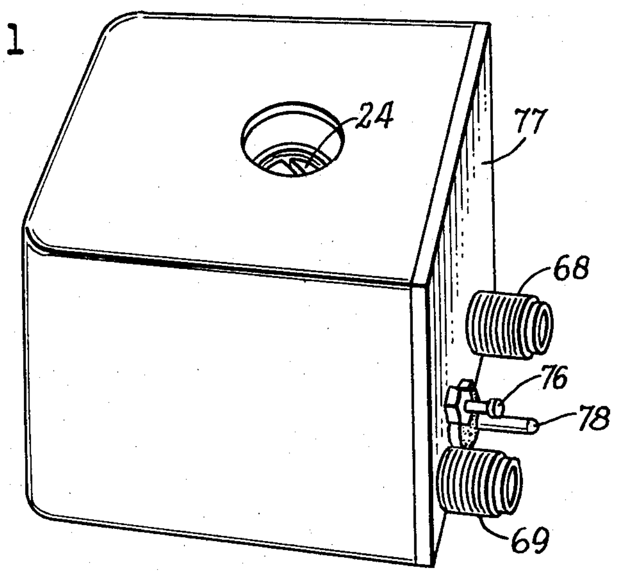
FIGURE 1 is a perspective view of the completely assembled microwave source.
Figure 2:
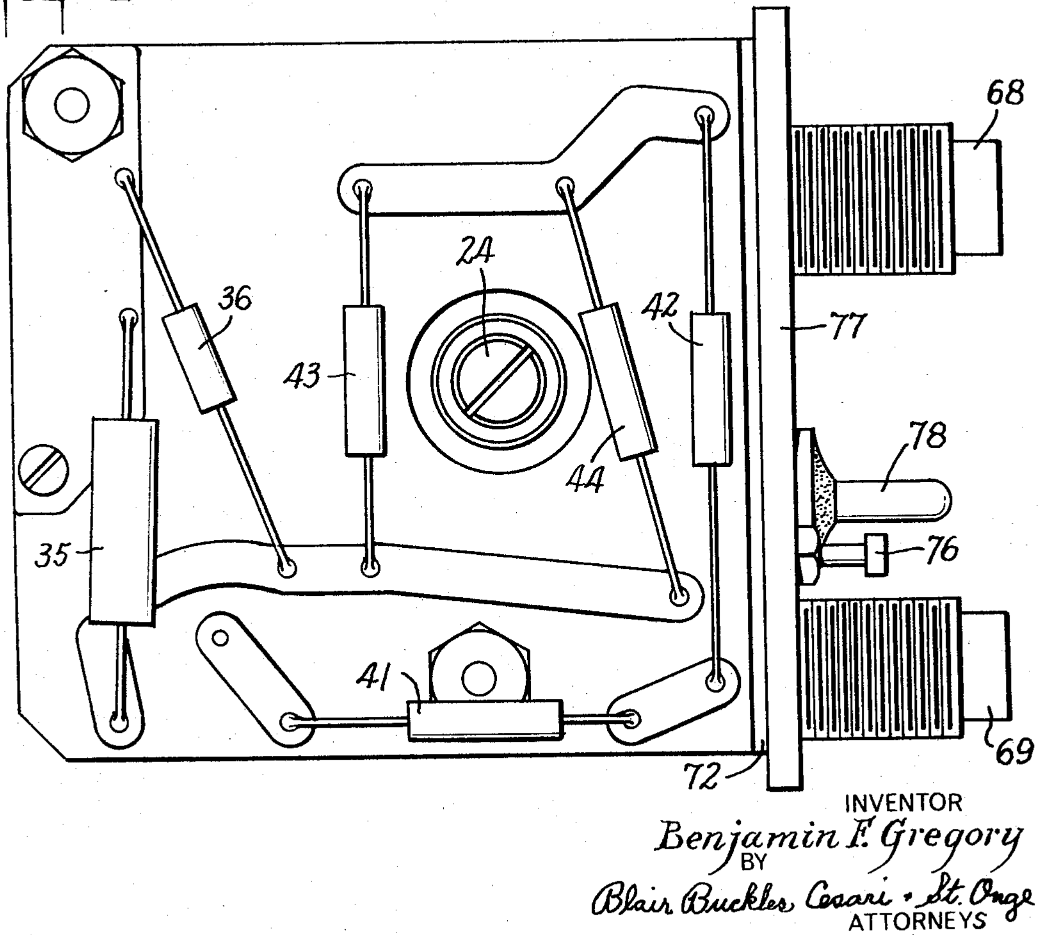
FIGURE 2 is a top plan view of a first deck circuit board as seen within the microwave source of FIGURE 1 when the external case is removed. The components providing the temperature compensating functions are shown in this view.
Figure 3:
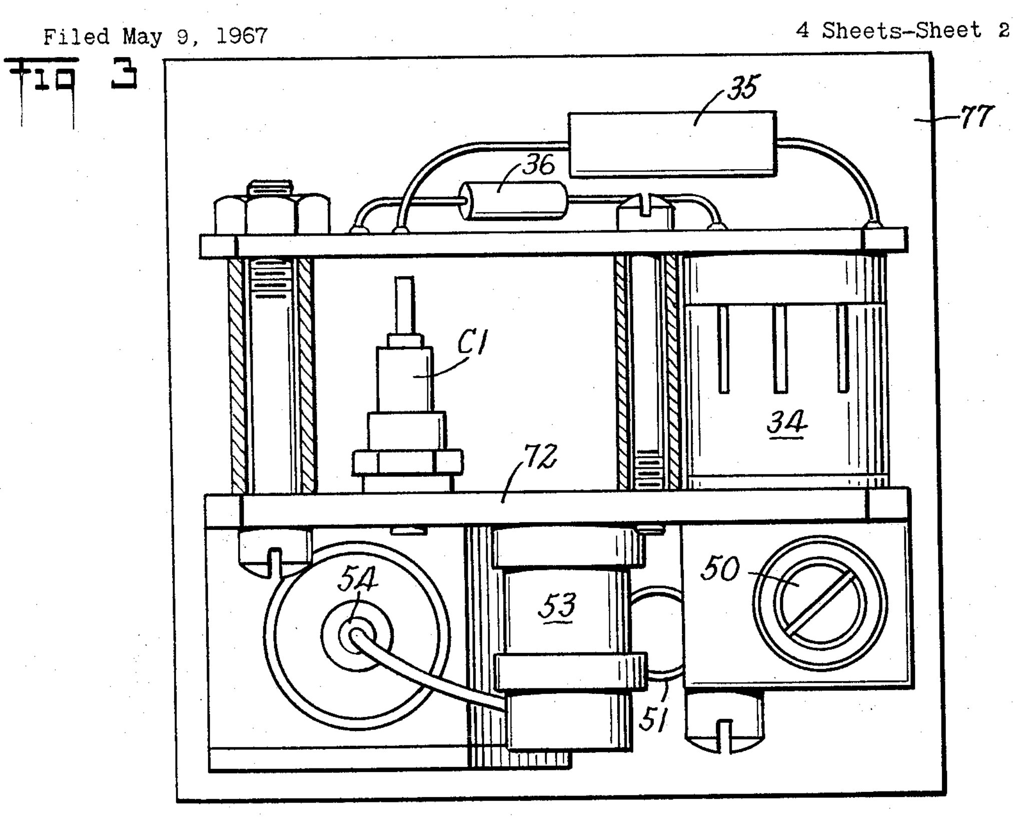
FIGURE 3 is a rear elevation view of the structure of FIGURE 2, showing three main decks of circuit components.
Figure 6:
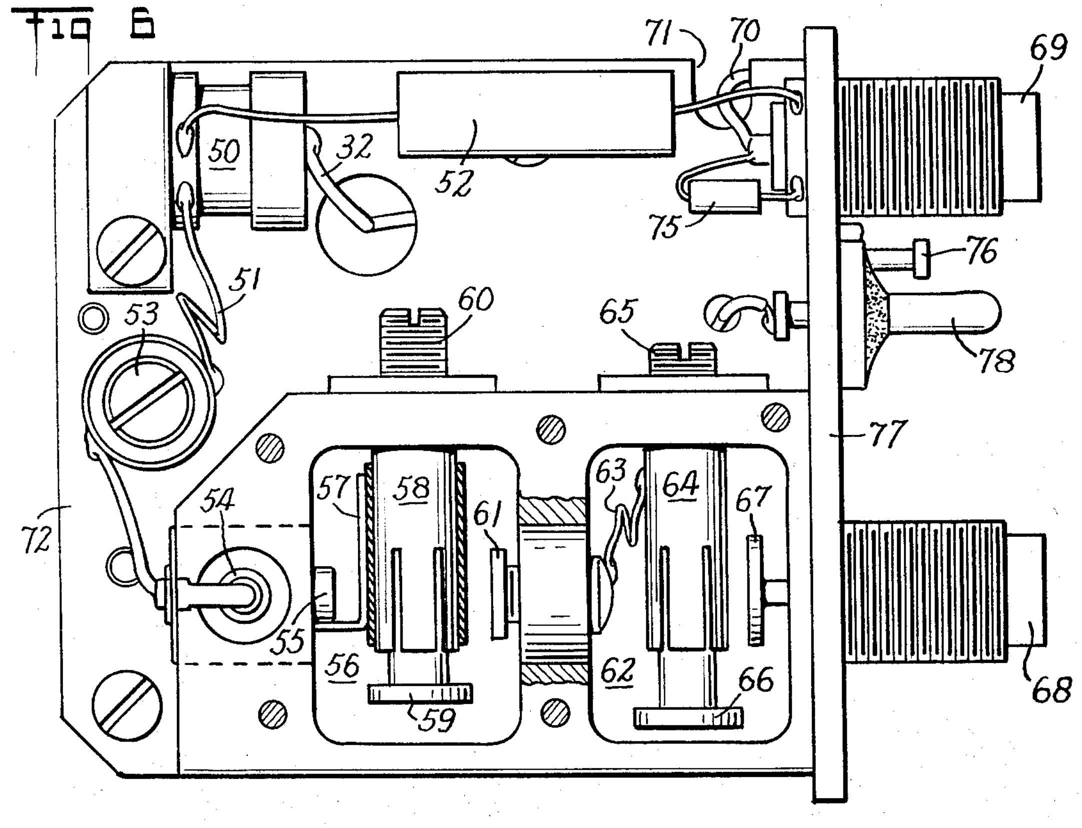
FIGURE 6 is a bottom view of the structure of FIGURE 5 with the multiplier cavity cover removed to show the internal construction.

Reference is now made to the frequency multiplier portion of this microwave source, the physical structure of which is shown in FIGURE 6 of the drawings and represented schematically in FIGURE 10. It is to be noted that this portion of the device is constructed integrally with the circuits already described, and the entire device forming the completed microwave source is compactly enclosed as a unit within a metallic casing shown in FIGURE 1. Thus all of the components are subjected to the same environmental temperatures, and the temperature compensating network 40 of FIGURE 9 is designed to control all changes in tubing which may be affected by temperature variations.

The operation of the frequency multiplier section of the microwave source will now be described with reference to FIGURES 6 and 10 of the drawings. The output signal from the fundamental oscillator circuit of FIGURE 8 is transferred via line 32 to the multiplier input coupling capacitor 50, which is preferably adjustable as shown. Capacitor 50 is adjusted to a value which maximizes the coupling of UHF energy from the oscillator of FIGURE 8 while minimizing the feedback coupling of harmonic frequencies from the multiplier circuit of FIGURE 10 into the UHF signal generator of FIGURE 8. A series inductance 51, which may be only a single loop as shown in FIGURE 6, serves as a radio frequency choke to further impede the reflection of unwanted harmonics from the multiplier to the oscillator, while also functioning in combination with variable capacitor 53 to form a tank circuit in the multiplier input which is tuned by variable capacitor 53 to the input UHF frequency signal which is then applied to a step recovery diode 54. Bias is applied to diode 54 through a positive temperature coefficient sensistor 52. Step recovery diode 54 responds to the applied UHF signal in a well known manner to generate a great many multiple signals which are harmonics of the applied fundamental frequency. These harmonic frequencies generated by diode 54 are fed by conductor 55 into a first guarter-wave resonant tuned cavity 56 where they are capacitively coupled by element 57 to central tuning post 58. Tuning of cavity 56 is accomplished by varying the effective electrical length of post 58 through adjustment of external tuning screw 60 to vary the extension of plunger cap 59. In the preferred embodiment of the invention cavity 56 is tuned to the fifth harmonic of the fundamental oscillator frequency, although it is to be understood that any other desired harmonic may be selected. The resonant energy within the first cavity 56 is capacitively coupled by probe 61 to a second quarter wave tuned cavity 62 where it is applied directly through a small inductive loop 63 to a central tuning post 64. Cavity 62 is precisely tuned to the desired frequency by adjustment of external tuning screw 65 which controls the positioning of tuning plunger 66. The second cavity 62 provides greater selectivity of the desired harmonic by rejecting any residual components of adjacent harmonic frequencies which may have passed through the first cavity 56. The resonant energy of the selected fifth harmonic in cavity 62 is capacitively coupled by probe 67 to an output connector 68. Thus, by means of the multiplier of FIGURE 10, the UHF signal from the oscillator circuit of FIGURE 8 is multiplied in frequency five times to produce the desired microwave output in C band.

Figure 4:
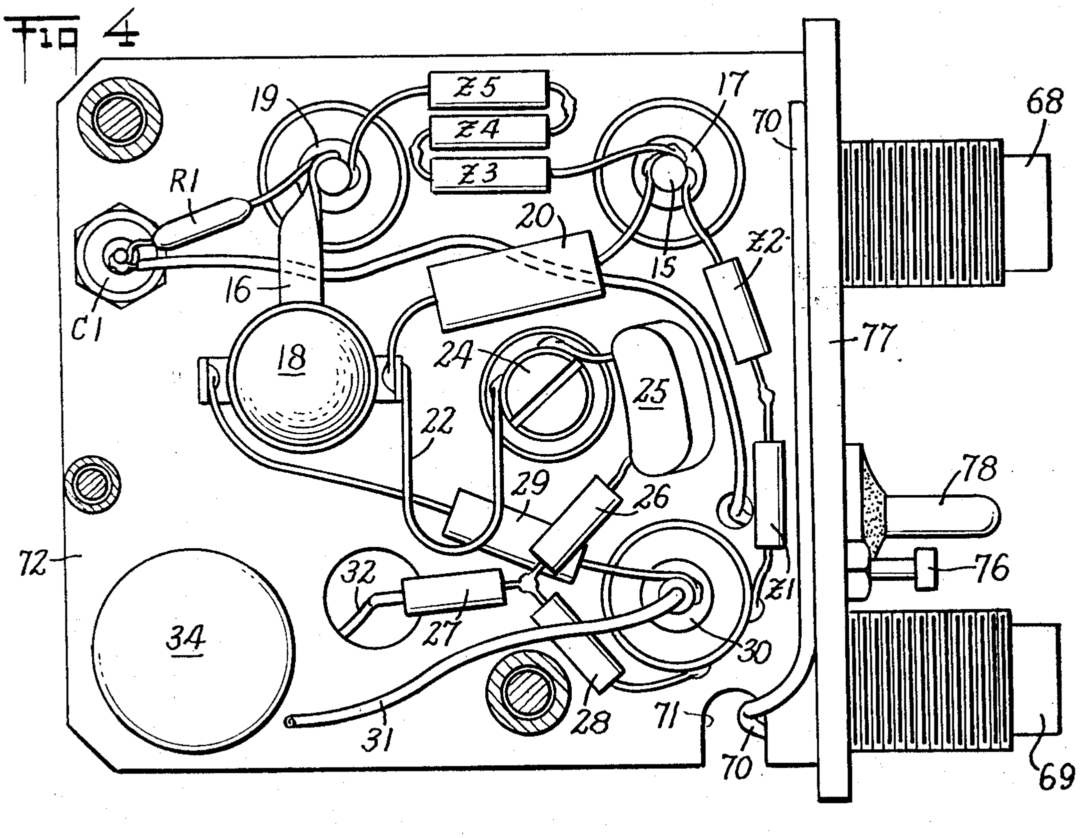
FIGURE 4 is a top plan view of the second, or middle, deck of circuit components in the structure of the microwave source, showing the fundamental oscillator elements.
Figure 5:
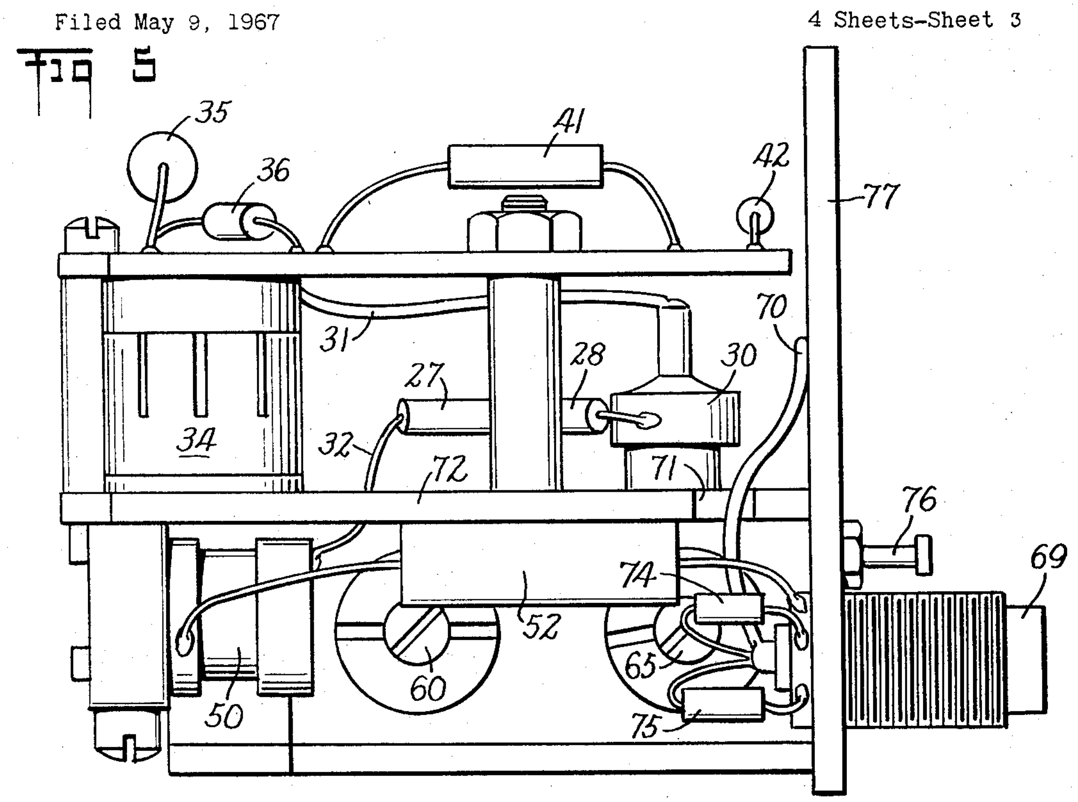
FIGURE 5 is a side elevation view of the structure shown in FIGURES 2 and 3.

In the preferred embodiment of the invention shown in FIGURES 1 through 6, a second output port 69 provides a reference signal output at the UHF fundamental frequency by means of a simple inductive pick up 70 which is merely a short length of insulated wire connected at one end to the center terminal of coaxial connector 69 and having its free end passing through an opening 71 in the oscillator circuit board 72 and into general proximity with the oscillator circuit elements, as best shown in FIGURES 4 and 5 of the drawings. This feature is not essential to the operation of the microwave source, but may be useful for such purposes as testing or monitoring the frequency without imposing any drain on the microwave output. To adapt this low power UHF output to match a fifty ohm coaxial line, fifty ohms of fixed resistance is connected across the terminals of connector 69. Because of space limitations we prefer to use two 100 ohm 10 watt resistors 74 and 75 in parallel, as shown in FIGURE 5 of the drawings. A ground terminal 76 is affixed to the front plate 77 of the device, and a B+ terminal 78 is insulatingly mounted on plate 77, as shown in FIGURES 1, 2, 4, 5 and 6.

All of the components of the microwave source are susceptible to changes in operating and frequency determining characteristics as influenced by changes in environmental temperature, but the frequency multiplier portion of the device is perhaps the most sensitive to such changes as it requires relatively larger mechanical structures in which even the slightest change in physical dimensions through metal expansion or contraction may radically affect the tuning of the resonant cavities. Such changes within the frequency multiplier portion of the device reflect adversely upon the tuning of the fundamental oscillator, as changes in the harmonic frequencies reflected back to the oscillator source from the multiplier have a tendency to "pull" or detune the fundamental oscillator. However, the incorporation of the temperature compensating network 40 in intimate physical relation with both the fundamental oscillator circuit and the frequency multiplier structure enables the circuit of FIGURE 9 to completely retune the oscillator of FIGURE 8 so as to fully compensate for the effects of temperature change on all circuits of the device, including the most susceptible multiplier output circuit of FIGURE 10.

*Alternative FM embodiment*

Reference is now made to the broad-band frequency modulation embodiment of the invention, as disclosed schematically by FIGURE 11 of the drawings. In this embodiment of the invention among the objectives are, to provide broad-band tuning capability with substantially constant power output, and to maintain the central operating frequency of the source under precise control of the modulating original input. That is, the source output frequency should be repeatable for any particular modulating signal input, regardless of very substantial changes in environmental temperature of the device. Unfortunately, however, in all known prior devices designed for this purpose, ambient temperature variations have had a significant effect with respect to the modulating signal input versus the operating frequency characteristics of such FM microwave sources. The incorporation of the FM oscillator circuit of FIGURE 11 into the structure shown in FIGURES 1–6, in lieu of the CW oscillator circuit shown in FIGURE 8, obviates these deficiencies of the prior art and results in a stable FM microwave source having the desired characteristics of wide-band electronic tuning and uniform frequency modulation response over a wide range of environmental temperature changes, as proven in operation from −55° C. to +125° C.

Referring now in greater detail to the circuit of FIGURE 11, it will be seen that the basic oscillator elements comprising the transistor 18, tank inductor 22, tuning capacitor 24, and output T-pad attenuator 26, 27 and 28 are the same as in the CW oscillator circuit of FIGURE 8. The base and collector potentials are applied by lines 15 and 16, respectively, through bypass capacitors 17 and 19, respectively, from the regulated power supply of FIGURE 7; the emitter current is controlled by the temperature compensating circuit of FIGURE 9 through line

31, and the UHF oscillator output is connected over line 32 to the frequency multiplier section of FIGURE 10. The additional elements of FIGURE 11, which are not present in FIGURE 8 comprise a coupling capacitor 80 connected with a tuning diode 81, a radio frequency choke 82, and through a bypass capacitor 83 and a further coupling capacitor 84 to a modulating signal input line 85. Bias for the tuning diode 81 is applied from an external terminal 86 through a bypass capacitor 87 and an isolating resistor 88. The tuning diode 81 is in effect a voltage variable capacitor, so that any change in effective capacity of diode 81 caused by voltage applied to line 85 will change the frequency of the UHF oscillator of FIGURE 11. Thus the oscillator may be frequency modulated by the application of a modulated signal voltage to line 85.

However, the remaining problem is that although the combined circuits of FIGURES 7, 11, 9 and 10 will now provide a microwave signal of stable central frequency and power output over wide ranges of temperature variation, it is still necessary to provide means for maintaining stable FM deviation sensitivity, in megacycles per volt of modulating signal, over the same wide range of environmental temperature change. This is accomplished by either of the signal input networks shown in FIGURE 12 and FIGURE 13. Each of these networks comprises a fixed resistor 90, a thermistor 91, and a "Sensistor" 92, the individual values of which are selected with the same considerations and in the same manner as described with reference to the network 40 of FIGURE 9.

Figure 13:
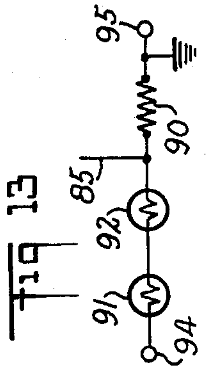
FIGURES 12 and 13 are schematic diagrams of alternate modulator inputs suitable for use with the FM oscillator of FIGURE 11.
Figure 12:
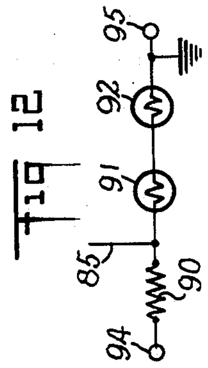

In the FM embodiment of FIGURE 11 and FIGURE 12 or 13 the characteristics of change in network resistance with temperature changes are utilized to compensate for changes in FM sensitivity which would otherwise occur as the environmental temperature varies. The modulating signal is applied to terminals 94 and 95 in FIGURES 12 and 13. The network of FIGURE 12 is employed in those cases where the modulation voltage on line 85 is required to increase as the ambient environmental temperature rises, while the network of FIGURE 13 is employed where the environmental circumstances require that the modulation voltage be decreased as ambient temperature rises. The choice of modulation network configuration may be determined empirically, in any given design, by testing the completed device over any required range of environmental temperatures.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention which, as a matter of language, might be said to fall therebetween.

Having described my invention, what I claim as new and desire to secure by Letters Patent is:

1. In a radio frequency oscillator circuit wherein a first transistor is employed as means for generating a fundamental radio frequency signal, temperature responsive frequency tuning means comprising, (A) a second transistor having its collector and emitter terminals respectively connected between the emitter terminal of said first transistor and a bias resistor to ground, whereby the emitter current of said first transistor flows through said second transistor, and (B) a temperature sensitive variable resistance network connected between the collector and base terminals of said second transistor.

2. The combination of claim 1 wherein said temperature sensitive variable resistance network comprises a first fixed resistor in series with a variable resistance element having a positive temperature coefficient of resistivity, a second fixed resistor in parallel with a thermistor having a negative temperature coefficient of resistance, and means connecting said series and said parallel resistive combinations in series with each other.

3. A temperature compensated source of radio frequency energy comprising in combination, (A) a first solid-state transistor device having base, collector and emitter terminals, (B) a radio frequency determining tuned tank circuit comprising inductance and capacitance connected between said base terminal and ground potential, (C) radio frequency choke means connecting said base terminal with direct current potential of a first value, (D) means connecting said collector terminal to direct current potential of a second value, (E) a second solid state transistor device having base, collector and emitter terminals, (F) radio frequency choke means connecting the emitter terminal of said first transistor to the collector terminal of said second transistor, (G) a pair of bias resistors connecting the emitter and base terminals of said second transistor to ground, whereby said first transistor is enabled to generate oscillatory signals at a fundamental frequency determined by said tuned tank circuit, (H) coupling means connecting said oscillatory tank circuit to a frequency multiplier whereby said fundamental frequency is multiplied, and (I) a temperature responsive resistance network connected between the collector and base terminals of said second transistor, whereby the emitter current of said first transistor is regulated by said second transistor and network to control the frequency of generated oscillatory signals as ambient environmental temperature is varied.

4. The combination of claim 3 wherein said first and second values of direct current potential are derived from a stable voltage regulator comprising a pair of Zener diodes joined in series with a fixed resistor, and said radio frequency choke is connected to the junction between said diodes while said collector terminal is connected to the junction between said series resistor and said diodes.

5. The combination of claim 3 wherein, (H) said frequency multiplier comprises a step function diode capacitively coupled to a first resonant cavity tuned to a selected harmonic of said fundamental frequency, and the output of said first tuned cavity is inductively coupled to a second resonant cavity tuned to the same harmonic frequency.

6. A temperature compensated source of radio frequency energy adapted for uniform frequency modulation response over a wide range of change in environmental temperature comprising, (A) a transistor oscillator having base collector and emitter terminals, (1) a fundamental frequency determining tuned circuit coupled between said base and collector terminals, (2) means for applying regulated direct current potential to said base and collector terminals, (3) means including a temperature responsive variable resistive network connected with said emitter terminal for controlling the emitter current of said transistor oscillator, (B) a tuning diode capacitively coupled to said frequency determining tuned circuit, (1) means for applying a constant bias voltage to said diode whereby said fundamental oscillator frequency is fixed, (2) means including a capacitive coupling for applying an alternating voltage to said diode, whereby the frequency of said oscillator may be varied, and (C) a temperature responsive variable resistance network for controlling modulation signal voltage applied to said tuning diode, (1) said network comprising a variable resistance element having a positive temperature coefficient of resistivity, a thermistor having a negative temperature coefficient of resistivity, and a fixed resistor, all connected in series across the modulation signal input terminals, and (2) means connecting the junction of said fixed resistance and said variable resistive elements to said capacitive coupling for applying said controlled modulation voltage to said tuning diode.

7. The combination of claim 6 wherein (A) said temperature responsive variable resistive network for controlling the emitter current of said transistor oscillator comprises (1) a first fixed resistor in series with a variable resistance element having a positive temperature coefficient of resistivity, (2) a second fixed resistor in parallel with a thermistor having negative coefficient of resistivity, (3) means connecting said series and said parallel resistive combination in series with each other, and (4) a direct current amplifier having its input circuit connected with said series connected resistive elements and its output circuit connected between said transistor emitter terminal and a ground return connection.

8. The combination of claim 7 wherein said direct current amplifier comprises a second transistor having collector, base and emitter terminals, (1) said series connected temperature responsive variable resistive elements are connected between the collector and base terminals of said second transistor, (2) the emitter of said first transistor is connected to the collector of said second transistor, and (3) the emitter of said second transistor is connected to ground through a fixed resistor.

9. A temperature compensated source of microwave radio frequency energy comprising in combination, (A) a source of stable regulated direct current power, including at least two series connected Zener diodes in series with a fixed resistor, (B) an ultra high frequency signal oscillator employing a transistor having collector, base and emitter terminals, (1) means including a radio frequency choke connecting said base terminal with a junction between said series connected Zener diodes, (2) means connecting said collector terminal with the junction between said fixed resistor and said series connected diodes, (3) a fundamental frequency determining tuned tank circuit comprising an inductance and a variable capacitance connected between said base terminal and ground potential, (4) a T-pad attenuator capacitively coupled to said tuned tank circuit and providing an output terminal for said ultra high frequency signals, (C) a frequency multiplier circuit comprising first and second tuned resonant cavities each tuned to a selected odd harmonic of said fundamental frequency, and each having an input and output port, (1) a step function diode connected across the input port of said first tuned resonant cavity, (a) means coupling the output from said ultra high frequency signal oscillator to said step function diode, (i) said coupling means including a capacitance and inductance tuned to form a resonant circuit at said ultra high fundamental frequency, (b) means including a temperature responsive variable resistance element having a high positive temperature coefficient of resistivity connected to said step function diode for controlling bias potential thereon, (2) capacitive means coupling the output port of said first tuned resonant cavity with inductive means coupled to the input port of said second tuned resonant cavity, (D) a temperature responsive current control circuit connected to the emitter terminal of said oscillator transistor for varying the emitter current thereof with changes in ambient environmental temperature, comprising, (1) a second transistor having collector, base and emitter terminals, (a) means connecting the collector terminal of said second transistor to the emitter terminal of said oscillator transistor, (b) means connecting the emitter terminal of said second transistor to ground potential, whereby the emitter current of said oscillator transistor flows through said second transistor between the collector and emitter terminals thereof, (2) a temperature responsive variable resistance network comprising first and second fixed resistors in combination with positive and negative temperature sensitive variable resistors connected between the collector and base terminals of said second transistor, (a) said first fixed resistor being connected in series with a variable resistance element having a positive temperature coefficient of resistivity, (b) said second fixed resistor being connected in parallel with a thermistor having a negative temperature coefficient of resistivity, and (c) said first series and second parallel resistive combinations being connected in series with each other and across said collector and base terminals of said second transistor.

10. The combination of claim 9 and means for electronically tuning said microwave source and for imparting temperature compensated frequency modulation to the signals thereof, comprising, (A) a tuning diode capacitively coupled to the tuned tank circuit of said ultra high frequency oscillator, (1) means including a radio frequency choke and series resistor connecting a controlled bias potential to said diode, whereby said fundamental oscillator frequency is fixed, (2) further means including a capacitive coupling for connecting an alternating voltage to said diode, whereby the frequency of said oscillator may be varied, (B) a temperature responsive modulator input circuit connected with said further means and comprising, (1) a variable resistance element having a positive temperature coefficient of resistivity, (2) a variable resistance element having a negative temperature coefficient of resistivity connected in series with said positive resistive element, (3) a fixed resistance element connected in series with both of said variable resistive elements, (4) means connecting the junction between said fixed resistance element and said variable resistive elements to said further means, and (5) means for connecting a modulation signal voltage across said series connected variable resistance elements.

No references cited.

JOHN KOMINSKI, *Primary Examiner.*